United States Patent
Kinard et al.

(10) Patent No.: US 8,534,591 B2
(45) Date of Patent: Sep. 17, 2013

(54) APPARATUS AND METHOD FOR LOADING A FILM CASSETTE FOR GASEOUS VAPOR DEPOSITION

(75) Inventors: Richard Dale Kinard, Wilmington, DE (US); Kirstin H. Shilkitus, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 911 days.

(21) Appl. No.: 12/550,811

(22) Filed: Aug. 31, 2009

(65) Prior Publication Data
US 2011/0049285 A1    Mar. 3, 2011

(51) Int. Cl.
*B65H 18/08* (2006.01)
*B65H 75/20* (2006.01)

(52) U.S. Cl.
USPC ............... 242/536; 242/602.1; 242/602.3

(58) Field of Classification Search
USPC ............ 242/536, 602, 602.1, 602.3, 416, 242/421; 396/597, 599
See application file for complete search history.

(56) References Cited

U.S. PATENT DOCUMENTS

| | | | | | |
|---|---|---|---|---|---|
| 2,243,453 | A | * | 5/1941 | Busse | 242/602.3 |
| 2,400,943 | A | * | 5/1946 | Morgan et al. | 242/602 |
| 2,461,039 | A | * | 2/1949 | Debrie | 242/602 |
| 2,714,571 | A |   | 8/1955 | Irion et al. | |
| 3,109,877 | A |   | 7/1960 | Wilson | |
| 3,114,539 | A |   | 12/1963 | Wilson et al. | |
| 3,272,175 | A |   | 9/1966 | Lorenz et al. | |
| 3,547,370 | A | * | 12/1970 | Leopold et al. | 242/602.3 |
| 3,549,101 | A | * | 12/1970 | Krause | 242/602.3 |
| 3,795,370 | A | * | 3/1974 | Dean | 242/602 |
| 3,906,966 | A | * | 9/1975 | Drake et al. | 242/536 |
| 4,428,658 | A | * | 1/1984 | Moore et al. | 396/597 |
| 4,921,556 | A |   | 5/1990 | Hakiel et al. | |
| 4,945,293 | A |   | 7/1990 | Wittkopf et al. | |
| 5,014,084 | A |   | 5/1991 | Tirone | |
| 5,209,182 | A |   | 5/1993 | Ohta et al. | |
| 5,226,968 | A |   | 7/1993 | Ohmi et al. | |
| 6,013,723 | A |   | 1/2000 | Akao | |
| 6,464,813 | B1 |  | 10/2002 | McQuaid et al. | |
| 6,719,236 | B1 |  | 4/2004 | Douglas et al. | |
| 2004/0001922 | A1 | | 1/2004 | Meyer | |
| 2006/0251821 | A1 | | 11/2006 | Eidelman | |
| 2006/0273219 | A1 | | 12/2006 | McCollough et al. | |
| 2007/0123005 | A1 | | 5/2007 | Hiura et al. | |

(Continued)

FOREIGN PATENT DOCUMENTS

| | | |
|---|---|---|
| EP | 0526702 B1 | 5/1992 |
| GB | 555485 | 8/1943 |
| GB | 597894 | 2/1948 |
| GB | 2171502 A | 8/1986 |
| JP | 2004161314 A | 6/2004 |
| WO | 9809902 A1 | 3/1998 |
| WO | 2006094834 A1 | 9/2006 |

OTHER PUBLICATIONS

Paterson Photographic Ltd. Darkroom Accessories Pamphlet pp. 1-5, Tipton, West Midlands, UK, Paterson Autoload Reel as shown on p. 4, date believed to be 2006.
Hewes Website, Photograph of a Spiral Cassette, Downloaded and Viewed Feb. 4, 2010.

*Primary Examiner* — William A Rivera

(57) ABSTRACT

The present invention is an apparatus and method for loading a film cassette for gaseous vapor deposition. The invention comprises careful alignment of a film cassette and a supply roll such that film can be transferred from the supply roll to the cassette while minimizing touching, ceasing or cracking the film.

2 Claims, 13 Drawing Sheets

(56) References Cited

U.S. PATENT DOCUMENTS

| | | |
|---|---|---|
| 2007/0224777 A1 | 9/2007 | Hamelin |
| 2007/0259129 A1 | 11/2007 | Ripley et al. |
| 2008/0081114 A1 | 4/2008 | Johanson et al. |
| 2009/0188961 A1 | 7/2009 | Nakagame et al. |
| 2011/0048327 A1 | 3/2011 | Carcia et al. |
| 2011/0048328 A1 | 3/2011 | Carcia et al. |
| 2011/0048991 A1 | 3/2011 | Carcia et al. |

* cited by examiner

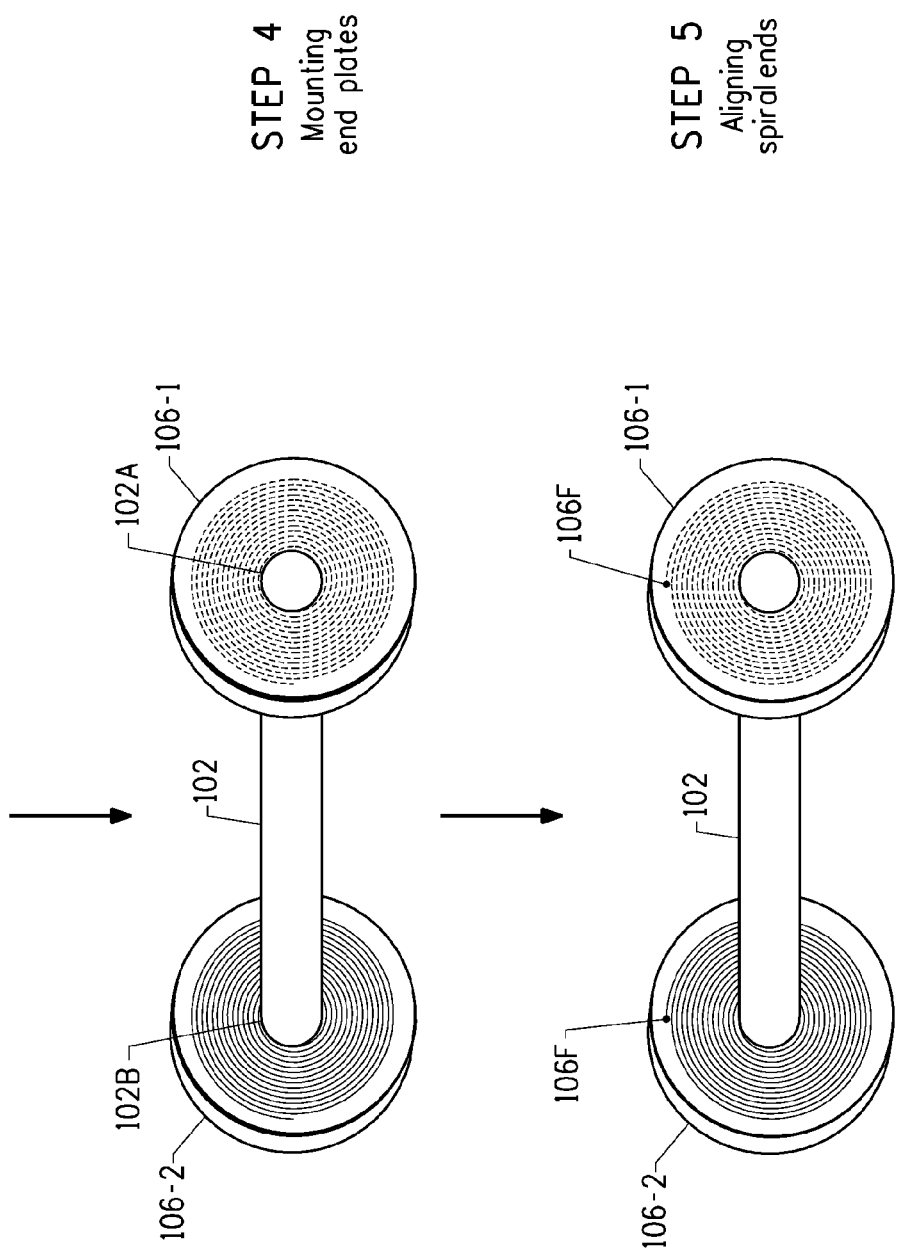

APPARATUS AND METHOD FOR LOADING A FILM CASSETTE FOR GASEOUS VAPOR DEPOSITION

CROSS REFERENCE TO RELATED APPLICATIONS

Subject matter disclosed herein is disclosed and claimed in the following copending applications, all filed contemporaneously herewith and all assigned to the assignee of the present invention:

Film Cassette For Gaseous Vapor Deposition, U.S. application Ser. No. 12/550,743, filed Aug. 31, 2009;

Loaded Film Cassette For Gaseous Vapor Deposition, U.S. application Ser. No. 12/550,766, filed Aug. 31, 2009;

Method for Making A Film Cassette For Gaseous Vapor Deposition, U.S. application Ser. No. 12/550,787, filed Aug. 31, 2009;

Apparatus For Gaseous Vapor Deposition, U.S. application Ser. No. 12/550,832, filed Aug. 31, 2009; and Apparatus and Method For Unloading A Film Cassette For Gaseous Vapor Deposition, U.S. application Ser. No. 12/550,856, filed Aug. 31, 2009.

BACKGROUND OF THE INVENTION

1. Field of the Invention

This invention relates to a film cassette for supporting a film substrate during a gaseous vapor deposition process, to a method for making the cassette, to an apparatus for depositing one or more materials on a substrate using a gaseous vapor deposition process, and to apparatus and methods for loading and unloading the cassettes.

2. Description of the Art

In order to manufacture affordable thin film photovoltaic modules an industrial length roll of an ultra-barrier film (on the order of 10 to 200 meters or more) and about 350-1650 mm in width is needed. An acceptable ultra-barrier film should be able to limit the entry of water vapor and/or oxygen into the photovoltaic layer of a thin film photovoltaic module to a water vapor transmission rate of less than $5\times10^{-4}$ g-$H_2O$/$m^2$-day. Entry of water vapor or oxygen is deleterious since it tends to rapidly destroy the photovoltaic layer of the module.

Currently, it is possible using a roll-to-roll process to manufacture coated films (such as used for bags of comestible snack products) that have a water vapor transmission rate only as low as $10^{-3}$ g-$H_2O$/$m^2$-day. Attempts to use the available roll-to-roll technology to manufacture industrial length rolls of ultra-barrier film for organic light emitting diodes (OLED's) proved unsuccessful, falling far short of the threshold ($5\times10^{-4}$ g-$H_2O$/m 2-day units) necessary for a film to be effective as an ultra-barrier.

In these previous attempts at roll-to-roll manufacturing of coated ultra-barrier film for OLED's a material was deposited onto the surface of a film substrate using chemical or gaseous vapor deposition, such as the process known as atomic layer deposition. During previous roll-to-roll manufacturing attempts, the process rollers contact against the full surface of the substrate, producing surface scratches on the substrate. Moreover, the substrate undergoes significant bending as it is conducted from one roller to another, producing additional cracks through the deposited barrier coating. Such scratches, abrasions, creases or cracks destroy the ability of any deposited barrier coating to prevent moisture or oxygen ingress.

Film cassettes able to support lengths of silver halide film (typically between 35 to 100 mm in width) during chemical batch processing development are known in the photographic arts. Such cassettes typically support the film being developed in a spiral fashion. In a spirally wrapped cassette the film being processed is held edgewise in the spiral groove of the cassette, without the surface of the film being contacted. Representative of such prior art film cassettes are a metallic cassette sold by Hewes Photographic Equipment Manufactures, Bedfordshire, England, and a plastic cassette sold by Paterson Photographic Limited, West Midlands, England.

There are, however, difficulties in scaling either metal wire (stainless steel) or commonly available plastic spiral wound cassettes for use with a film having a width greater than 100 mm.

Although the high rib pitch to interspoke spacing of these silver halide cassettes (about 2.5-6.5%) is ideal for allowing photographic processing liquids to penetrate the spaces between the turns of the spirally wound photographic film, such a high pitch-to-interspoke spacing ratio is very inefficient for processing industrial rolls of film for an ultra-barrier. Only a short length of film is able to be carried on a cassette with such a high rib-pitch-to-interspoke spacing.

Fabrication of metal wire cassettes and low temperature plastic cassettes wider than 100 mm has proven to be difficult since small variations in winding/welding the wire or flow lines in injection molding the plastic cassettes cause distortion of the end plates. These structural distortions would make a film difficult to load. The film would also have a tendency to fall out of the spiral grooves.

Although the metal wire cassettes can take the harsher processing conditions of vapor deposition, their symmetric rib geometry (aspect ratio of 1:1) isn't wide enough to hold the film as it expands from room to processing temperatures, especially for rib pitches less than about 6 mm. The plastic cassettes distort at the harsher processing conditions of vapor deposition, which are well above the heat deflection temperature of the plastic. In addition the self-threading feature of some plastic cassettes creates debris as a film substrate slides along the soft plastic ribs of the cassette.

Accordingly, in view of the foregoing, it is believed advantageous to provide a film cassette that is able to edgewise support a spirally wrapped industrial length roll of a film substrate during a vapor deposition process in a way that minimizes scratching of the film surface during processing and which minimizes risk of creasing or cracking of the film or coating during loading and unloading, thus enabling the manufacture of an industrial length ultra-barrier film.

SUMMARY OF THE INVENTION

In one aspect the present invention is directed to a cassette for supporting a length of a film substrate during a gaseous vapor deposition process. The cassette comprises a central shaft having a first and a second end plate mounted thereon. Each end plate comprises a central hub from which radiate a plurality of angularly spaced spokes. The spokes have an interior surface that lies on a reference plane oriented substantially perpendicular to the axis of the shaft. The interior surfaces of spokes are confrontationally disposed and spaced apart by a predetermined interspoke spacing defined between the reference planes.

Each end plate has a spiral rib mounted to the interior surface of the spokes thereon. Each spiral rib has a predetermined number of uniformly spaced turns and a predetermined pitch associated therewith. The spaces between adjacent turns of the spiral rib define a spiral groove on each end plate able to accept an edge of a film.

Each rib has a cross sectional configuration in a radial plane containing the axis of the shaft. The cross sectional configuration has substantially linear major edges. Each rib exhibits a predetermined width dimension, a predetermined average thickness dimension, and a width-to-thickness aspect ratio of at least 2:1. In one embodiment the cross sectional configuration of the rib is substantially rectangular and may additionally include a flow spoiler at the free end thereof. In an alternate embodiment the cross sectional configuration of each rib is substantially wedge-shaped.

The interspoke spacing is at least three hundred millimeters (300 mm) and is also greater than the width dimension exhibited by a film substrate at a gaseous deposition temperature. The width dimension of the rib on each end plate is between about 0.5% to about 2.0% of the interspoke spacing.

In other aspects the present invention is directed to a cassette loaded with a predetermined length of a film substrate and to a vapor deposition apparatus having an insert within which a loaded cassette is received.

In still other aspects the present invention is directed to an apparatus and to a method for loading a film cassette and to an apparatus and to a method for unloading a film cassette and immediately laminating it to a protective cover sheet.

BRIEF DESCRIPTION OF THE DRAWINGS

The invention will be more fully understood from the following detailed description taken in connection with the accompanying Figures, which form a part of this application, and in which:

FIGS. 8A and 8B are diagrammatic views showing the steps of a method in accordance with the invention for manufacturing an end plate for a cassette and a cassette comprising two end plates;

DETAILED DESCRIPTION OF THE INVENTION

Figure 1:
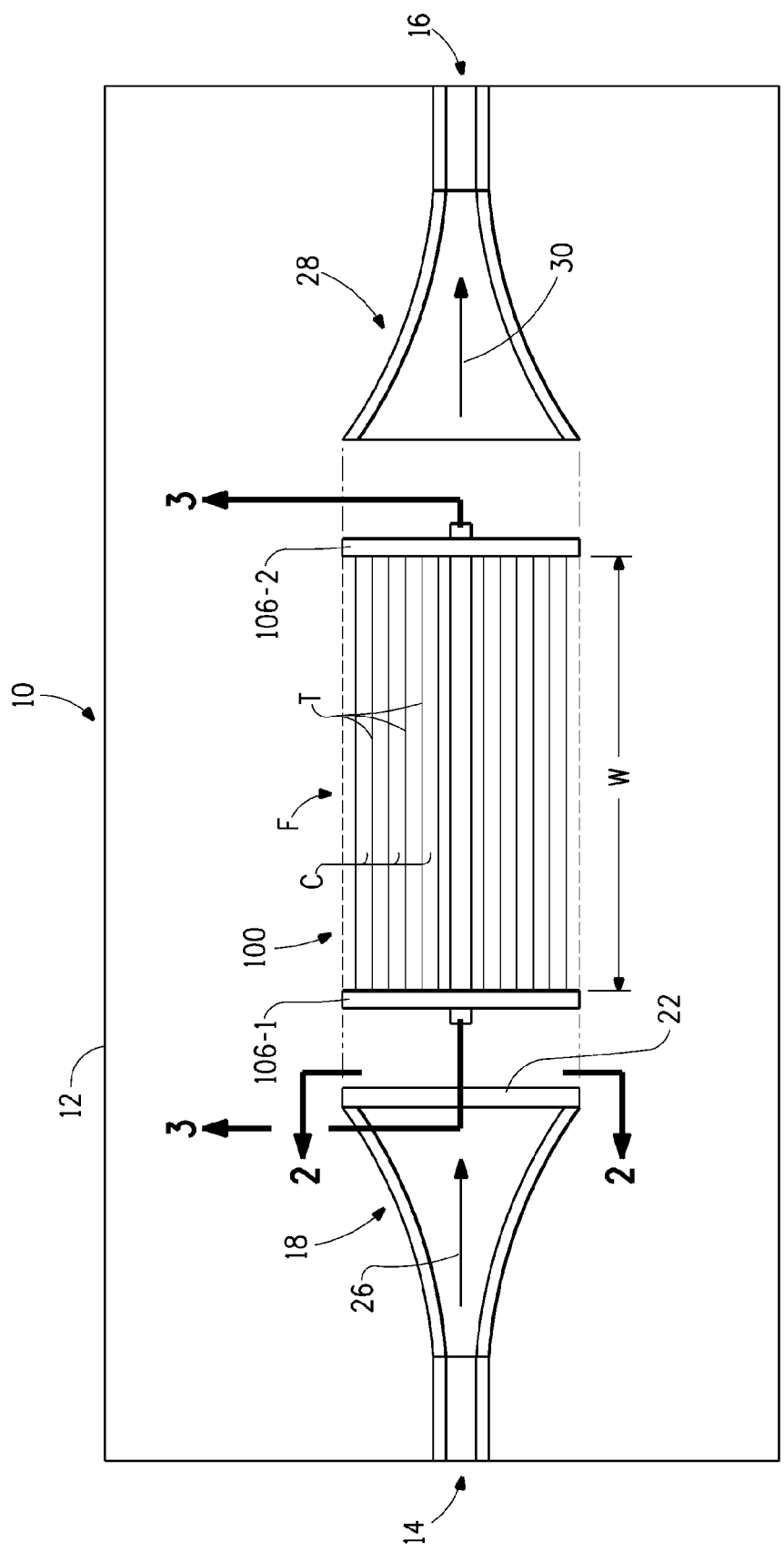
FIG. 1 is a stylized diagrammatic illustration of an apparatus for coating a film substrate using a gaseous fluid vapor deposition process that utilizes a film cassette in accordance with the present invention.

Throughout the following detailed description similar reference numerals refer to similar elements in all figures of the drawings.

FIG. 1 is a stylized diagrammatic illustration of an insert in accordance with the present invention (generally indicated by reference character 10) for coating a predetermined continuous length of a film substrate F with one or more materials using a gaseous fluid vapor deposition process. The film substrate F in roll form is illustrated in the Figures as being supported within the insert 10 by a cassette 100 also in accordance with the present invention.

The insert 10 is useful within a gaseous vapor deposition apparatus for fabricating an industrial lengths of an ultra-barrier film, i.e., a film having a water vapor transmission rate of less than $5 \times 10^{-4}$ g-$H_2O/m^2$-day. The ultra-barrier film is itself useful to protect the radiation collection surface of a photovoltaic module. To manufacture such an ultra-barrier film a transparent material (such as alumina $Al_2O_3$) is deposited on both surfaces of a polymeric film substrate using a process such as atomic layer deposition. The gaseous deposition temperature for atomic layer deposition of alumina $Al_2O_3$ on polyethylene terephthalate (PET) is in the range from about 80 to 120 degrees Centigrade.

An industrial roll of film substrate F (that is, a film roll able to be used in an industrial scale process for the manufacture of photovoltaic modules) should have a minimum length on the order of ten to two hundred meters or more (10 to 200 m). Preferably the film F has a thickness in the range from about 0.002 inches to about 0.010 inches (about 0.05 to about 0.25 millimeters) and more preferably on the order of 0.005 inches (0.13 millimeters). The film substrate F for such a use may have a predetermined nominal width dimension W (i.e., a width dimension at room temperature) in a range from at least three hundred millimeters (300 mm) to about sixteen hundred fifty millimeters (1650 mm). It is also appreciated that the width dimension of the substrate F may grow on the order of 0.4 to 0.6 percent due to thermal effects during the deposition process.

Figure 3:
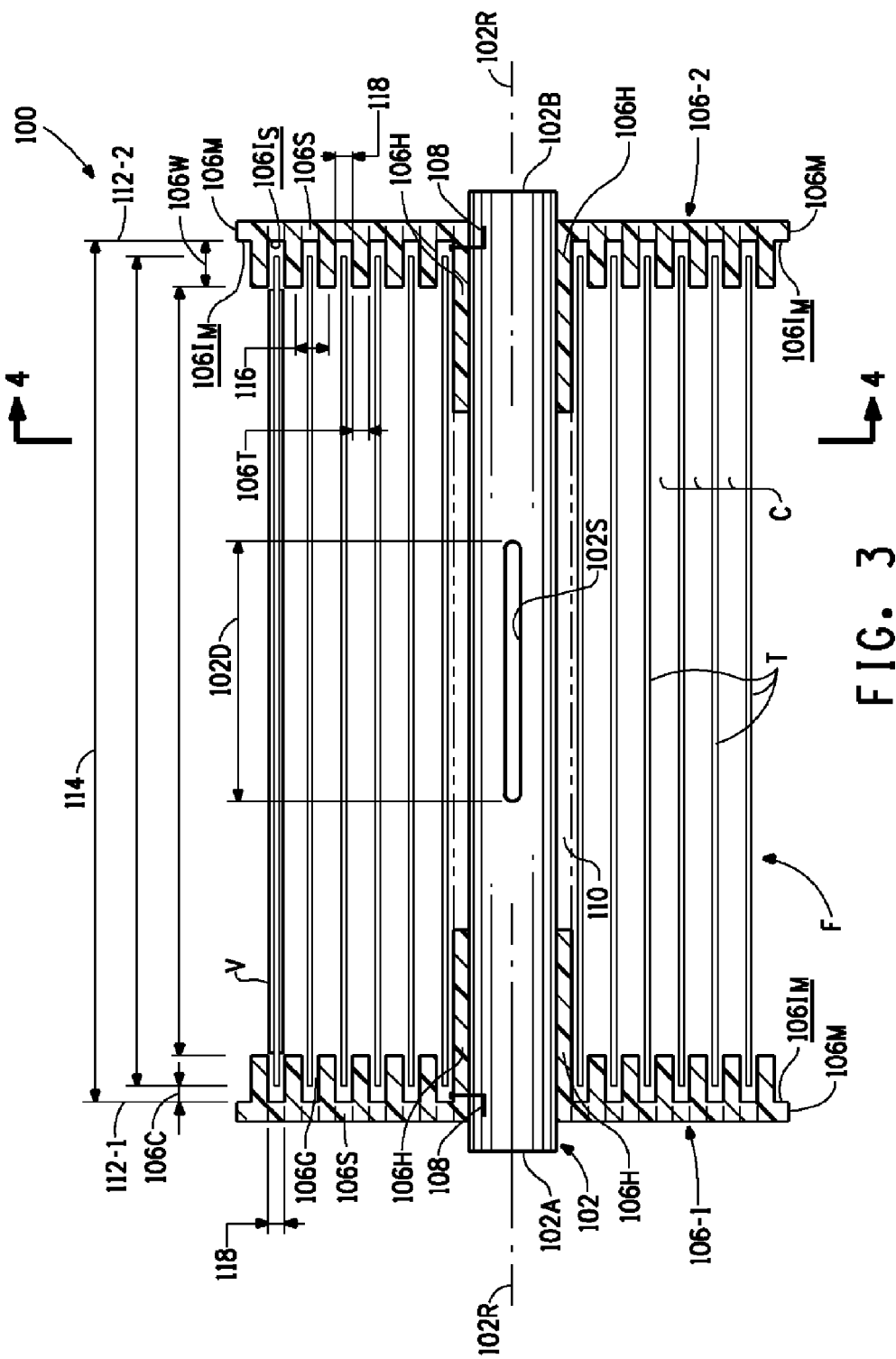
FIG. 3 is a section view taken along section lines 3-3 of FIGS. 1 and 4 showing a film cassette in accordance with the present invention for supporting a length of a film substrate during exposure to a gaseous fluid.

As diagrammatically suggested in FIGS. 1 and 3 and as will be developed herein, the structural features of the cassette 100 are sized and arranged such that when the film substrate F is edgewise supported by the cassette 100 adjacent turns T of the spirally wrapped roll of film F define an open (i.e., unobstructed) fluid conduction channel C through which a gaseous vapor is able to propagate. Such an unobstructed channel is vital to insuring that a coating is deposited on both surfaces of the film without discontinuities being formed.

It is also important to prevent bending, surface abrasion and/or the imposition of other forces that may cause creases or cracks to develop on the film and/or the coating while the film is loaded and unloaded from the cassette. Such abrasion, creases or cracks (even a crack of nanometer dimension) may vitiate the protective effect of the ultra-barrier deposited by the vapor deposition process. The size and arrangement of the structural features of the cassette 100 in accordance with the present invention are also selected with this end in mind.

As diagrammatically illustrated in FIG. 1 an insert 10 for use with a gaseous vapor deposition apparatus includes a pressure vessel 12 having a process fluid inlet port 14 and a process fluid outlet port 16. A suitable atomic layer deposition apparatus with which the insert 10 may be used is that apparatus known as "Planar 400" or "Planar 800" available from Planar Systems Inc., Hillsboro, Oreg.

A diverging flow director 18 is connected to the process fluid inlet port 14. The diverging flow director 18 serves to direct and to distribute uniformly a laminar flow of gaseous fluid toward a first end plate 106-1 of the cassette 100, as indicated by the flow arrow 26. The diverging flow director 18 is contacted against or lies within a predetermined close distance of the exterior surface of the end plate 106-1.

A converging flow director 28 may be disposed within the insert 10 adjacent to the end plate 106-2 disposed at the opposite end of the cassette 100. The converging flow director 28 serves to conducts vapor emanating from the end plate 106-2 to the outlet port 16, as illustrated by the flow arrow 30. Preferably, the converging flow director 28 is contacted against or lies a predetermined close distance to the exterior surface of the end plate 106-2.

Figure 2:
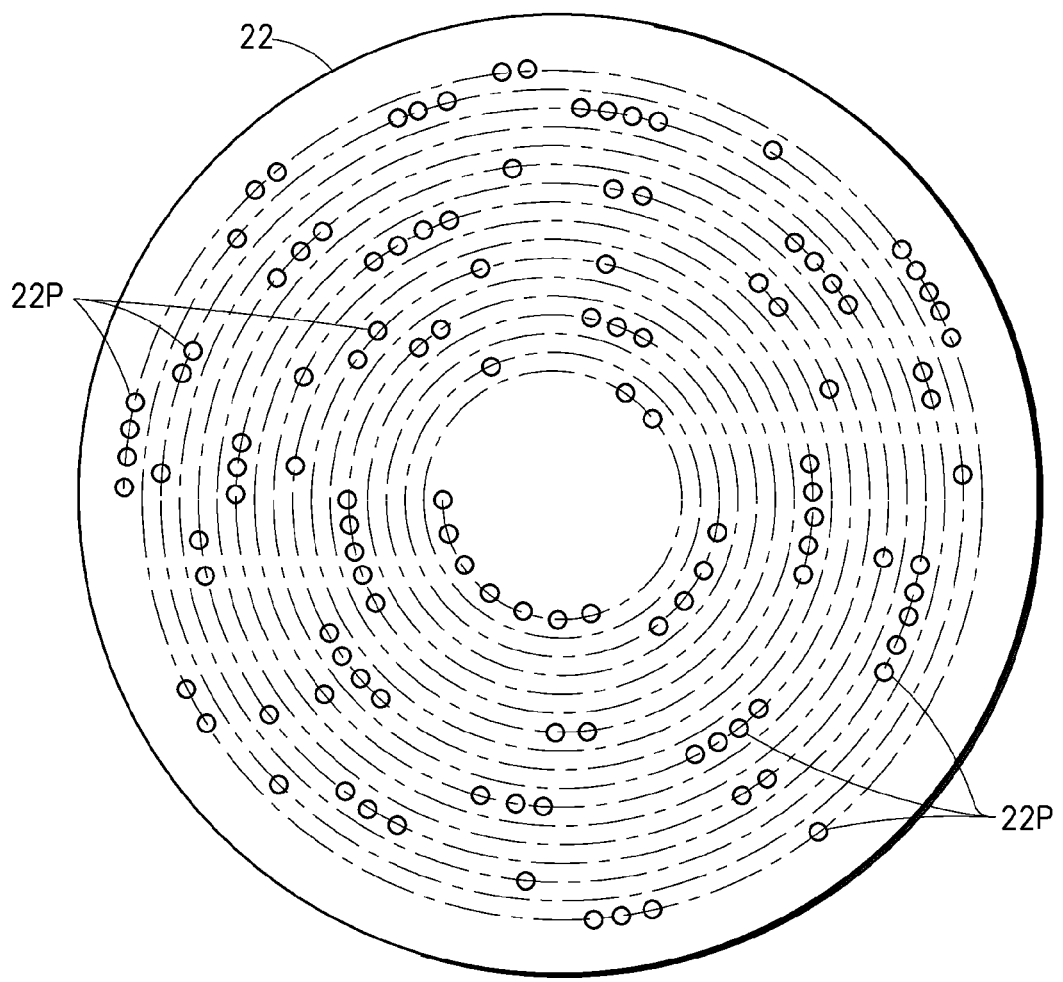
FIG. 2 is an elevation view of an optional diffuser plate used in the vapor deposition apparatus of FIG. 1.

In the embodiment illustrated the diverging flow director 18 includes an optional diffuser plate 22 that is facially engaged against or within the close distance of the end plate 106-1. The diffuser plate 22 is shown in elevation in FIG. 2 and includes a plurality of openings 22P arranged in a spiral configuration. The plate may be manufactured from a material having a coefficient of thermal expansion similar to alumina, such as aluminum or titanium.

FIG. 3 illustrates a side elevation view, entirely in section, of the film cassette 100. The cassette 100 comprises a central shaft 102 onto which are mounted the first end plate 106-1 and the second end plate 106-2.

In the embodiment illustrated each end plate 106-1, 106-2 is a generally circular member comprising a central hub 106H from which radiate a plurality of angularly spaced spokes 106S. The radially outer ends of the spokes 102S may be connected by an outer rim 106M. The shaft 102 extends through the openings in each of the hubs 106H. Once positioned the hubs 106H are conveniently secured to the shaft 102, as by adhesive or a fastener 108. Preferably the position of each end plate 106-1, 106-2 along the shaft 102 is adjustably selectable.

The shaft 102 is an elongated hollow member having first and second ends 102A, 102B thereon and a reference axis 102R extending therethrough. The shaft 102 is preferably fabricated of aluminum or titanium, although any other suitably rigid metallic or polymeric material able to withstand the processing temperature may be used. The surface of the shaft 102 is interrupted by a slot 102S that extends a predetermined distance 102D along the length of the shaft. The slot 102S is parallel to the reference axis 102R.

Figure 5:
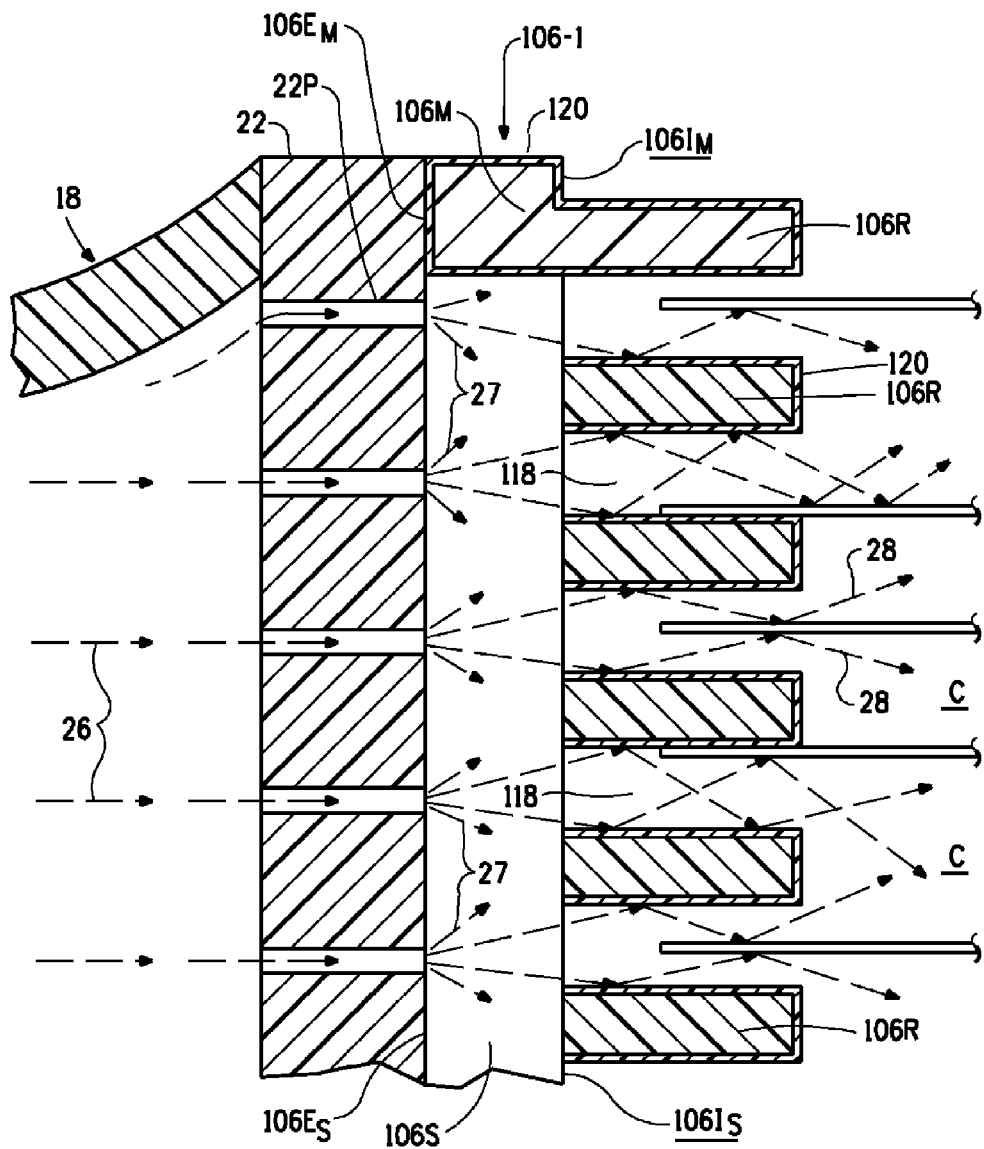
FIG. 5 is a section view taken along section lines 5-5 in FIG. 4 showing the edges of a film substrate as received by the cassette and also illustrating the flow of vapor through the diffuser plate and into the flow passages defined between adjacent turns of the film substrate as the same is supported by the cassette.

As perhaps best seen in FIG. 5, the rim 106M and each of the spokes 106S have thereon an exterior surface $106E_M$ and $106E_S$, respectively, and an interior surface $106I_M$ and $106I_S$, respectively. The exterior surface $106E_M$ of the rim 106M serves as a convenient surface against which the plate 22 of the diverging flow director 18 and the converging flow director (if provided) may contact.

The interior surfaces $106I_M$ and $106I_S$ of the rim and spokes on each end plate are confrontationally disposed with respect to the each other. In the embodiment illustrated the interior surfaces $106I_M$, $106I_S$ of each end plate 106-1, 106-2 lie on a respective reference plane 112-1, 112-2. Each end plate 106-1, 106-2 has a spiral rib 106R mounted to at least the interior surface $106I_S$ of the spokes 106S. The interior surface $106I_M$ of the rim 106M may be offset from the reference plane 112-1, 112-2, as the case may be, so long as the surface $106I_M$ of the rim does not extend inwardly beyond the end of ribs 106R. The reference planes 112-1, 112-2 are oriented substantially perpendicular to the axis 102R of the shaft 102.

With the end plates 106-1, 106-2 secured at a desired position on the shaft 102 a predetermined axial interspoke spacing 114 is defined between the confronting reference planes 112-1, 112-2. Once the cassette is configured to exhibit a desired predetermined interspoke spacing 114 between the end plates, the hubs and shaft should be secured such that the interspoke spacing 114 does not vary by more than one-quarter to three millimeters (0.25-3 mm) around the perimeter of the end plates.

The outer diameter of the shaft 102 should be radially equal to the outer diameter of the hubs 106H of the end plates 106-1, 106-2 so that the hubs and shaft present a radially uniform surface between the end plates. To this end the shaft 102 in the embodiment illustrated has a sleeve 110 disposed on the shaft 102 between the confronting reference planes 112-1, 112-2. The sleeve 110 has the same outer diameter as that of the hub 106H. The sleeve 110 is provided a slot that registers with the slot 102S in the shaft 102.

As noted each end plate 106-1, 106-2 has a spiral rib 106R mounted to at least the interior surface $106I_S$ of the spokes 106S. A portion of the rib may also be mounted to the interior surface $106I_M$ of the rim 106M. The spiral rib 106R on each end plate 106-1, 106-2 has a predetermined number of uniformly spaced turns having a predetermined pitch dimension 116. The pitch dimension 116 is measured at a given angular position on an end plate in a radial direction with respect to the axis 102R of the shaft 102. For example, the pitch dimension 116 may be taken between the centers of adjacent turns of the spiral rib.

Figure 4:
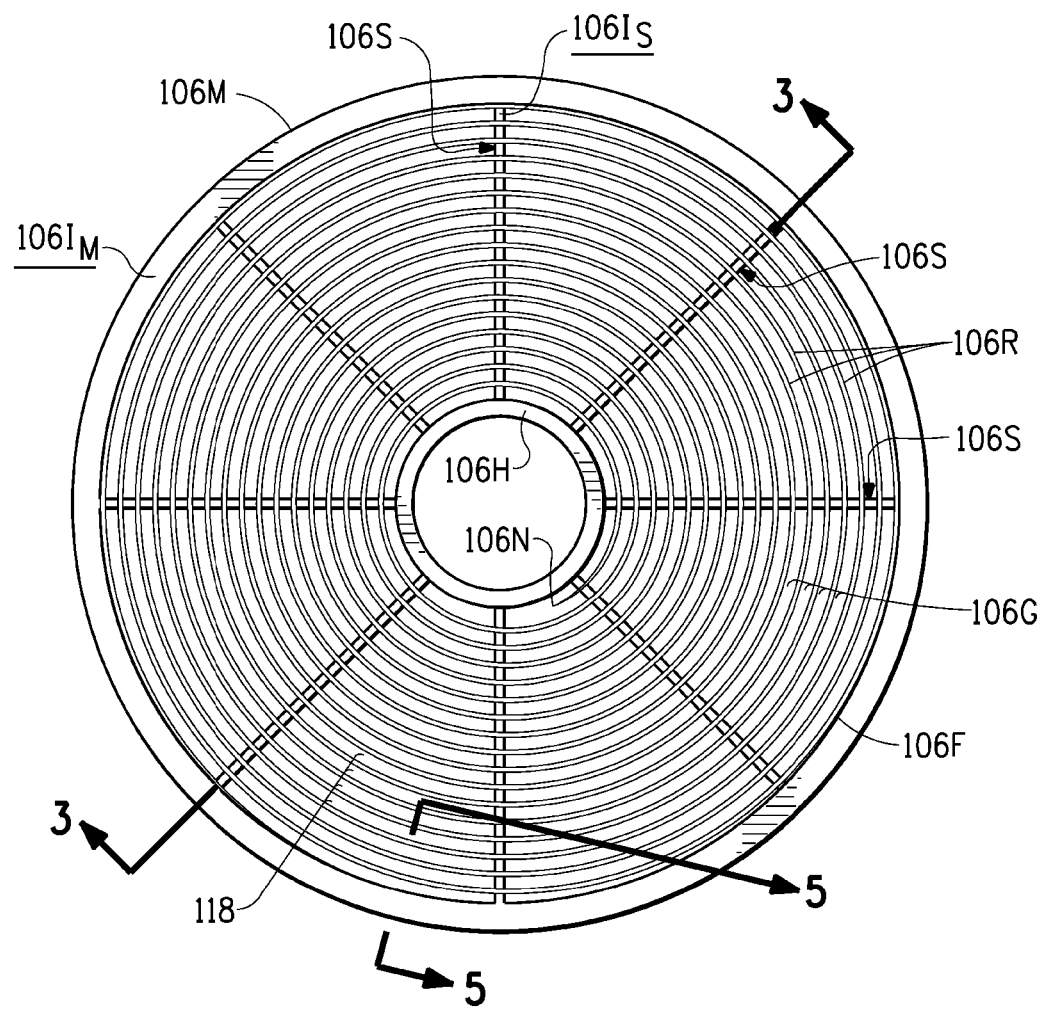
FIG. 4 is an elevation view taken along view lines 4-4 in FIG. 3.

The open spacing 118 between adjacent turns of the spiral rib 106R define a continuous spiral groove 106G on each end plate 106-1, 106-2. The groove 106G has a first, outer, end 106F and a second, inner, end 106N (FIG. 4). The spiral grooves 106G on the end plates are arranged such that the first and second ends 106F, 106N of each respective groove axially align.

Each rib 106R has a cross sectional configuration in a radial plane containing the axis of the shaft. Generally speaking, the cross sectional configuration of the rib 106R exhibits substantially linear major edges, as perhaps best illustrated in FIGS. 5, 7A, 7B. The rib 106R on each end plate has a predetermined width dimension 106W and a predetermined average thickness dimension 106T. The width dimension 106W is measured from the interior surface $106I_S$ of the spokes 106S on which the rib 106R is mounted (i.e., from the reference plane 112-1, 112-2) to the free end of the rib and is taken in a direction parallel to the axis of the shaft. The predetermined minimum thickness dimension 106T is measured in a radial direction with respect to the axis of the shaft 102. The average thickness dimension is the average of the thickness dimensions of the rib taken at a predetermined number of points across the width of the rib. In accordance with the present invention the rib has a width-to-average-thickness aspect ratio of at least 2:1.

In the embodiment of the invention shown in FIGS. 3 through 6 each rib 106R has a substantially rectangular cross sectional configuration. By substantially rectangular it is meant that the major edges of the cross sectional configuration of the rib are substantially parallel to each other along substantially the entire width and the thickness dimension 106T of the rib is substantially uniform throughout substantially the entire width of the rib. If desired the free end of the rib may have rounded edges.

Figure 7A:
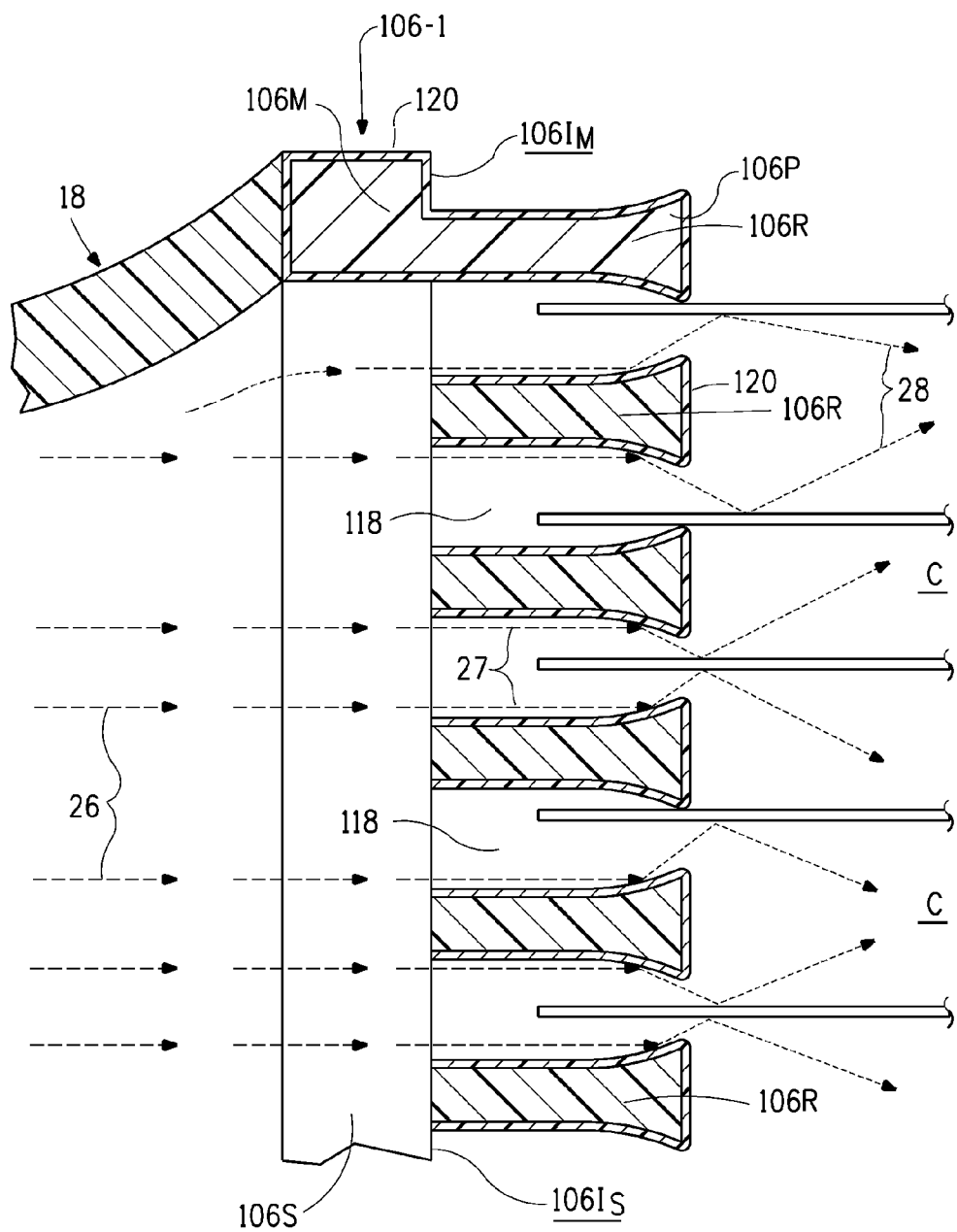
FIGS. 7A and 7B are section views showing alternate cross sectional configurations for the rib of the film cassette.

A modified embodiment of a rib having a substantially rectangular cross section is shown in FIG. 7A. Such a modified rib includes a flow spoiler 106P disposed at the free end thereof. The purpose of the flow spoiler 106P is discussed in detail herein.

A rib in accordance with the present invention may also be configured to exhibit a substantially wedge-shaped cross sectional configuration 106W. Such an alternately configured embodiment of the rib is shown and discussed in connection with FIG. 7B.

As alluded to above, in accordance with the present invention, various structural features of the cassette 100 are sized and arranged to exhibit dimensions within the following ranges.

The interspoke spacing 114 is at least as large as the nominal width dimension of the film substrate being supported by the cassette. Thus, generally speaking, a cassette in accordance with the present invention has an interspoke spacing 114 that is at least about three hundred millimeters (300 mm).

In addition, the interspoke spacing 114 is also greater than the width dimension exhibited by a film substrate F at a gaseous deposition temperature so that, when the substrate F is received on the cassette, a clearance distance 106C (FIG. 3) is defined between the edge of the substrate F and the interior surface of the spoke.

The width dimension 106W of the rib 106R on each end plate is also important. As shown by the following Table 1, in accordance with the present invention the width dimension 106W should be in the range from about 0.5% to about 2.0% of the interspoke spacing.

TABLE 1

| Film Width (mm) | Interspoke Spacing (mm) | Width of Rib (mm) | Percentage of Interspoke Spacing |
|---|---|---|---|
| 350 | At least 350 | 2-6.5 | 0.57-1.86% |
| 700 | At least 700 | 4-8 | 0.57-1.14% |
| 1000 | At least 1000 | 6-12 | 0.60-1.20% |
| 1350 | At least 1350 | 8-16 | 0.59-1.18% |
| 1650 | At least 1650 | 10-20 | 0.60-1.20% |

Figure 6:
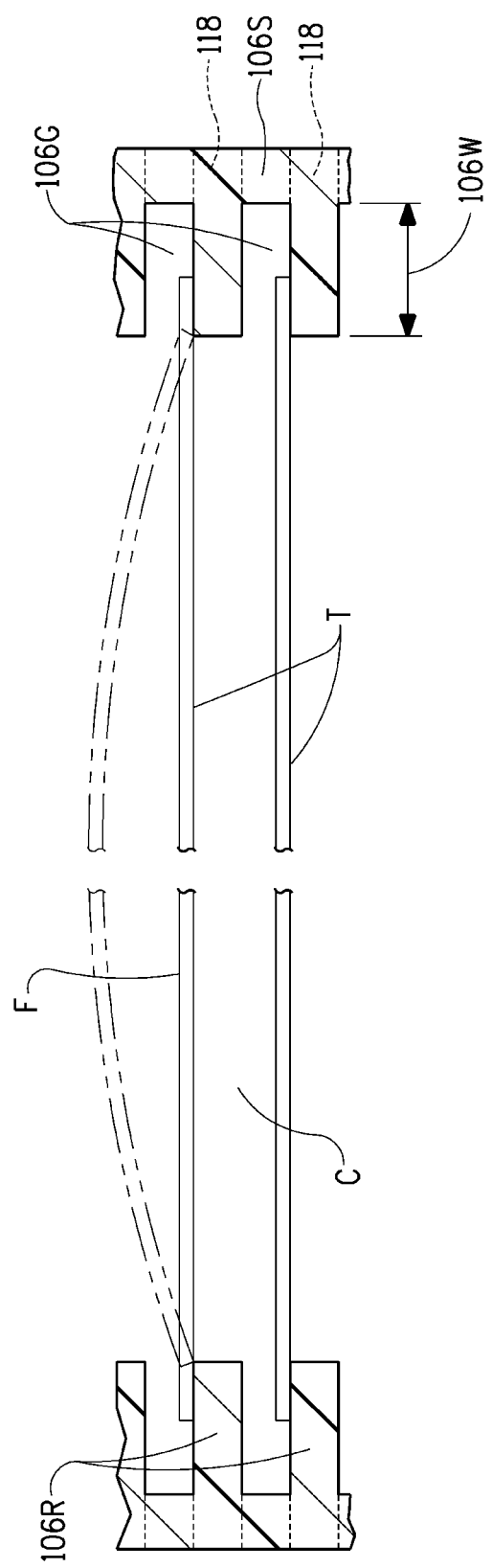
FIG. 6 is a section view generally similar to FIG. 5 showing the relative positions between the edges of a film substrate as received by the cassette during a vapor deposition process and as the finished substrate is removed from the cassette.

The effect of configuring a cassette having a rib width 106W and an interspoke spacing 114 within the above-defined ranges may be understood from FIGS. 5 and 6.

As suggested in FIG. 6, a cassette having ribs 106R with a width dimension 106W within the defined range insures that a film substrate F having a given stiffness when received within the spiral groove 106G will be edgewise supported and will not sag or otherwise obstruct the fluid conduction channel C defined between adjacent turns T of the film F. The free outer end of a film roll having a film width greater than about 500 mm may require the support provided by an axially extending stiffener V (FIG. 3).

The clearance distance 106C accommodates any enlargement to the film's width dimension owing to thermal expansion during processing of the film at the process temperature. Providing edgewise support to the film also minimizes the possibility of the film being touched by operator, which may leave unwanted organic matter on the surface of the film. Edgewise support of the film may minimize damage/debris and yield loss to film.

The flow path of vapor through a cassette 100 in accordance with the present invention is best illustrated in FIG. 5. It is noted that owing to the stiffness of the film F it is possible that the edge of the film may not be in contact with the same surface of a rib throughout the full length of the film. Thus, as suggested in FIG. 5, an edge of the film F may contact either the radially inner or radially outer surface of the rib, or may reside in the spacing between adjacent turns of the rib.

Presently, a gaseous vapor deposition apparatus relies upon a diffusion mechanism to transport a gaseous fluid into contact with the surface being coated. However, diffusion based processing requires relatively long cycle times to coat one layer on the film. Coating cycle time is able to be reduced using an insert 10 of the present invention.

As discussed in connection with FIG. 1 the insert 10 includes a diverging flow director 18 having a diffuser plate 22 disposed in facial contact against or within a close distance of the end plate 106-1. As shown by the flow arrows in FIG. 5 the presence of the diverging flow director 18 serves to direct and to distribute uniformly a laminar flow 26 of gaseous fluid toward the passages 22P in the diffuser plate 22. The laminar flow of process gas is accelerated as it is forced through the passages 22P and transitions to turbulent flow as it exits the plate and enters the space (defined by the axial dimension of the spokes) extant between the diffuser plate 22 and rib 106R. The conversion from laminar to turbulent flow is indicated by the fanned array of flow arrows 27. It is this turbulent flow 27 of gas that is conducted through the spaced openings 118 defining the spiral groove in the end plate 106-1 toward the flow channel C formed between adjacent turns T of the film F. By disposing the plate 22 in contacting relationship with the end plate 106-1 (or within a close distance thereof) gas leakage is minimized.

Thus, when using a diverging flow director 18 in conjunction with a diffuser plate 22 the gas flows into the space between the ribs 118 and into the channel C with both a radial as well as an axial flow component, as indicated by the flow arrows 28. The radial component of flow into the flow channel C is needed to bring the precursors carried in the gas into direct contact with the substrate. Since only a very small percentage of the precursor gasses actually absorb to the substrate when they impact it, a radial component of the flow is required to increase the chances of absorbing, thus making the flow through the channel C more efficient and reducing the overall cycle time for an adequate ultra-barrier layer to develop. It is noted that a solely laminar flow will cause most of the precursors to travel the length of the flow channel without significant impingement on the substrate, reducing overall coating efficiency.

Figure 7B:
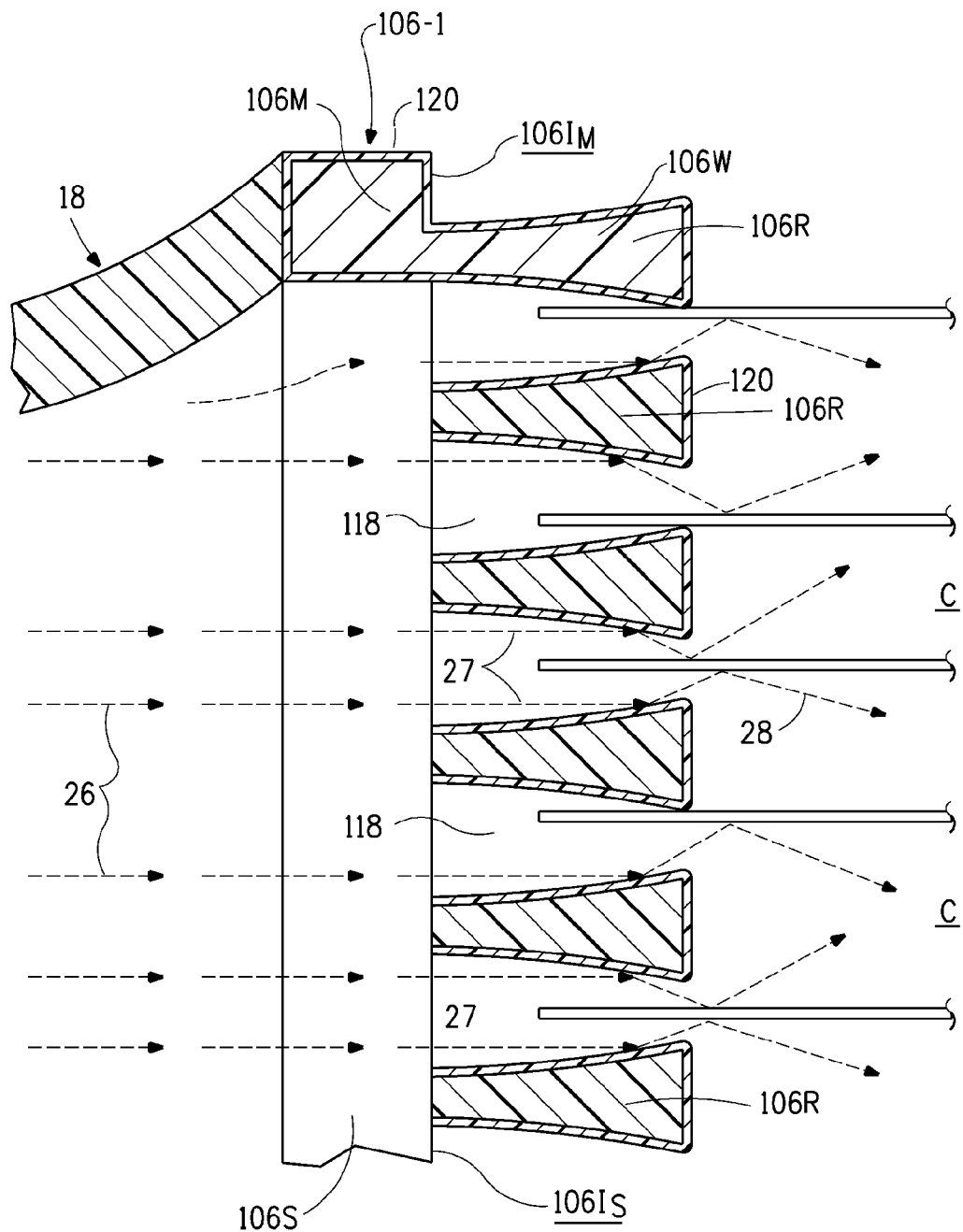

A diffuser plate 22 may be omitted if a modified rib configuration as shown in FIG. 7A or 7B is utilized on the end plate 106-1. When the rib 106R is configured as shown in these figures a laminar flow from the flow director 18 is converted into a turbulent flow as it enters the channel C. The conversion is effected either by the flow spoiler 106P (FIG. 7A) or by the wedge-shape 106D (FIG. 7B) of the rib.

An interspoke spacing 114 in the defined range additionally enables the film to be inserted into the groove without undue bending of the film surface. This is illustrated in FIG. 6. This means that the risk of creases or cracks forming on the film as it is loaded into the cassette or the risk that a coating on the substrate will be cracked when the film is unloaded from the cassette are both minimized.

In sum, by sizing a cassette in accordance with the present invention the interspoke spacing 114 and the rib width 106W are both wide-enough to edgewise support the film as it expands through the full temperature range of process temperatures without sag, yet narrow-enough to minimize film compression as the film is inserted and removed from the cassette, thus reducing creasing or cracking.

The capacity of the cassette in terms of the length of the roll of film able to be supported thereby is governed by the pitch dimension and the thickness dimension of the rib 106R. Ribs are as thin as possible to permit maximum gaseous fluid flow and maximum loaded film length yet adequately strong so as not to break while loading or unloading.

The relationship between rib pitch and film length is tabulated in Table 2.

TABLE 2

| Cassette OD mm | Length of Film @ 3 mm Rib Pitch | Length of Film @ 1 mm Rib Pitch |
|---|---|---|
| 200 | 9 m | 27 m |
| 350 | 31 m | 92 m |
| 600 | 64 m | 191 m |
| 700 | 127 m | 380 m |

The relationship of the rib pitch to the interspoke spacing is set forth in Table 3. In general, the pitch of each spiral rib is less than about 1.2% of the interspoke spacing, and more preferably, is less than about 0.5% of the interspoke spacing. The dimension 106T of the rib 106R on each end plate is less than about fifty percent of the pitch. As the interspoke spacing increases to accommodate wider film, the pitch of the rib, and thus, the radial dimension of the channel C should be increased proportionally to maintain the same flow resistance of the channel C.

TABLE 3

| Film Width (mm) | Interspoke Spacing (mm) | Pitch of Rib (mm) | Percentage of Interspoke Spacing |
|---|---|---|---|
| 350 | At least 350 | 1-4 | 0.28-1.14% |
| 700 | At least 700 | 1-5 | 0.14-0.71% |
| 1000 | At least 1000 | 1-6 | 0.10-0.60% |
| 1350 | At least 1350 | 1-7 | 0.07-0.51% |
| 1650 | At least 1650 | 1-8 | 0.06-0.47% |

As discussed, when the roll of film F is spirally wrapped on the cassette 100 the spaces between adjacent turns of the film cooperate to define the gas flow channel C extending axially across the cassette between the end plates. As best seen in FIGS. 4 and 5 the portions of each spiral groove 106G exposed between angularly adjacent spokes 106S on each end plate define the plurality of openings 118 for the ingress or egress of the gaseous fluid into the gas flow channel C. The angular dimension of the spokes 106S is selected such that the areal extent of the exposed portions of the grooves (i.e., the total area of the openings 118) is at least fifty percent of the predetermined area of the end plate.

The cassette 100 may be manufactured from a high temperature polymeric material such as a polycarbonate, liquid crystals, polyimid, acetal copolymer, Nylon 6, polypropylene and PEEK. The cassette may also be fabricated from a metal or ceramic.

Scraping between the film and the cassette could lead to debris generation within the cassette. The debris could be generated by abrasion of the film and/or abrasion of the material of the cassette.

This debris could degrade the properties of a coating being formed on the film. To minimize such scraping and debris generation at least the spiral rib 106R on each end plate is coated with a hard, abrasion-resistant layer 120 of a suitable ceramic or other protective material. The thickness of the coating 120 lies in the range from about 100 to about 2000 angstroms.

The coating material such as $Al_2O_3$, $TiO_2$, $ZrO_2$, $HfO_2$, and $SiO_2$ may be applied using an atomic layer deposition process. A coating of SiN or SiC may be applied by a chemical vapor deposition process. If the coating is alumina the coating thickness lies in the range from about 100 to about 1000 angstroms.

The coating has a predetermined surface roughness less than about fifty microns (50 microns) and a hardness greater than Shore D 30. In the preferred case, the coating is provided over the surface of the entire end plate.

-o-0-o-

Another aspect the present invention is directed to a process to make an end plate (e.g., end plate 106-1, 106-2) of a cassette in accordance with the invention able to support a length of film during exposure to a gaseous fluid at a temperature of 80 degrees centigrade or greater. The end plates and the cassette made from two end plates are particularly useful in a process for atomic layer deposition of an inorganic coating on polymer films.

As described above the end plate comprises a central hub 106H, an outer rim 106M and a rib 106R. The central hub 106H and the outer rim 106R are connected by spaced spokes 106S. The rib is in the form of a spiral extending from the central hub to near the outer rim. The rib is mounted against interior surface of the spaced spokes and has a spiral end near the outer rim.

The end plate is formed from polymeric material such as a polycarbonate, liquid crystals, polyimid, acetal copolymer, Nylon 6, polypropylene and PEEK. Since the coating processes for which the end plate may be used operate at temperatures of 80 degrees centigrade or greater, the polymer should be appropriate for service at these temperatures. The selected polymer should have a heat distortion temperature at low pressure above 80 degrees centigrade.

Figure 8A:
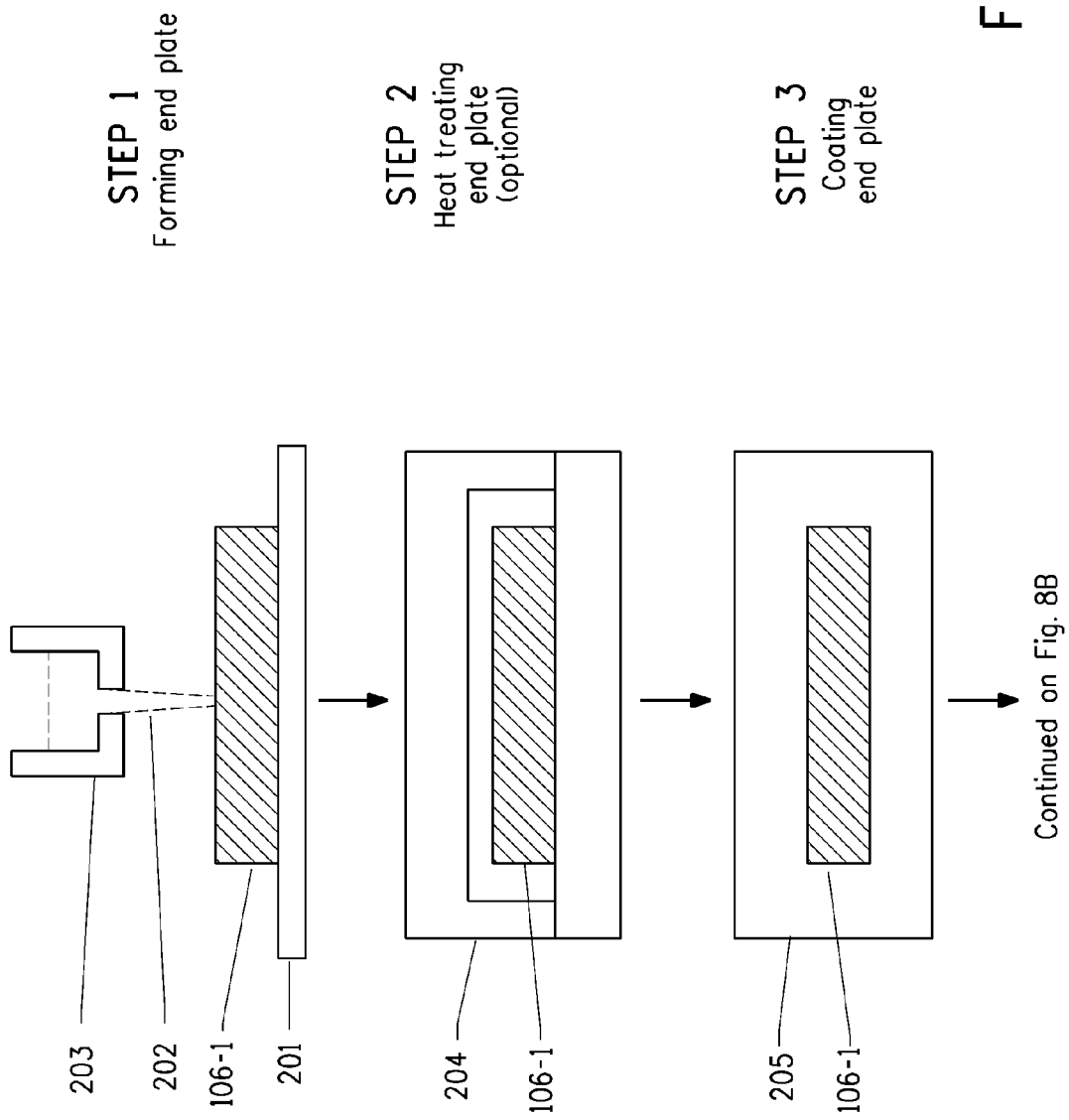

The process for making the end plate is shown schematically in FIG. 8A. The first step in the process is forming the uncoated end plate. For example a filament 202 emanating from a forming apparatus 203 is deposited onto a baseplate 201 to begin the build-up of the end plate. The end plate may be formed by known techniques such as rapid prototyping, powder sintering, injection molding or laser polymerization. In rapid prototyping, a prototyping machine reads data from a CAD drawing and lays down successive layers of liquid, powder, filament or sheet material to build up an object such as an end plate. In powder sintering, powder is injected into a mould and consolidated by heating. In injection molding, molten polymer is injected into a mould. In laser polymerization, a laser beam is irradiated in a pattern to deposit polymer from a vapor. For example, a fused deposition modeling apparatus available from Stratasys, Inc., Eden Prairie, Minn. as Stratasys "Vantage" model FDM may be used.

In an optional second step as shown in FIG. 8A the end plate is heat treated to reduce residual stresses. In the Figure, the end plate 106-1, 106-2 is located in a furnace 204. An industry standard (Blue-M) convection oven may be used.

Appropriate heat treating temperatures are at least twenty degrees above the temperature of inorganic coating deposition process in which the end plate may be used. For example, an atomic layer deposition process used to form an ultrabarrier operates at a minimum of 80 degrees centigrade. Accordingly, the heat treating temperature for such an end plate would be a minimum of 100 degrees centigrade.

The next step in the process is coating the polymer end plate with an inorganic coating such as alumina, silicon nitride, silicon carbide, $TiO_2$, $ZrO_2$, $HfO_2$, and $SiO_2$. If the coating is alumina the coating thickness lies in the range from about 100 to about 1000 angstroms.

This is shown schematically in FIG. 8A. The end plate 106-1, 106-2 is placed in a coating apparatus 205. This coating is used to smooth and harden the surface of the polymer end plate so that debris is not generated from wear of the end plate when a length of film is loaded or unloaded into the cassette. The surface roughness of the inorganic coating should be less than about fifty microns (50 microns) and the hardness of the inorganic coating should be greater than 30 on the Shore D scale. Debris may create defects in a coating applied to the film in the cassette. The coating system 205 may effect known techniques such as chemical vapor deposition, physical vapor deposition, or plasma deposition used for deposition of the inorganic coating on the end plate. The thickness of the coating may be 100 to 2000 angstroms, preferably 100 to 1000 angstroms for alumina. The coating may be deposited using a Planar P-400A atomic layer deposition platform.

Another aspect of the invention is a process to make a cassette (e.g., a cassette 100) for supporting a length of film during exposure to a gaseous fluid having a temperature 80 degrees centigrade or greater. The cassette 100 comprises two end plates which are each made as in the process described above. The process of making the cassette further comprises the steps of mounting each end plate 106-1, 1, 106-2 near each end 102A, 102B of a central shaft 102 as shown in FIG. 8B. The central shaft 102 may also be fabricated of a metal or the same polymers as the end plates. A hole in the central hub of the end plates may be sized to fit closely with the diameter of the central shaft. The end plates are mounted near the ends of the central shaft as shown in FIG. 8B.

The next step in the process of making the cassette, shown in FIG. 8B, is aligning the spiral ends of the rib 106R. The spiral ends 106F of the groove for both of the end plates should be located at the same axial position relative to the central shaft. This is necessary to accommodate loading and unloading of film into the space inside the spirals of the rib. One of the end plates is rotated about the shaft until the spiral ends are aligned. After aligning the spiral ends of the ribs the end plates may be secured to the central shaft by fastener 108 (such as a set screw) or adhesive. The central shaft may be slotted in secure the end of a film to facilitate loading of the film into the cassette. The dimensions of the slot in the central shaft may be may be in the range from about one hundred to about fifteen hundred fifty millimeters (100 to 1550 mm).

-o-0-o-

Figure 9A:
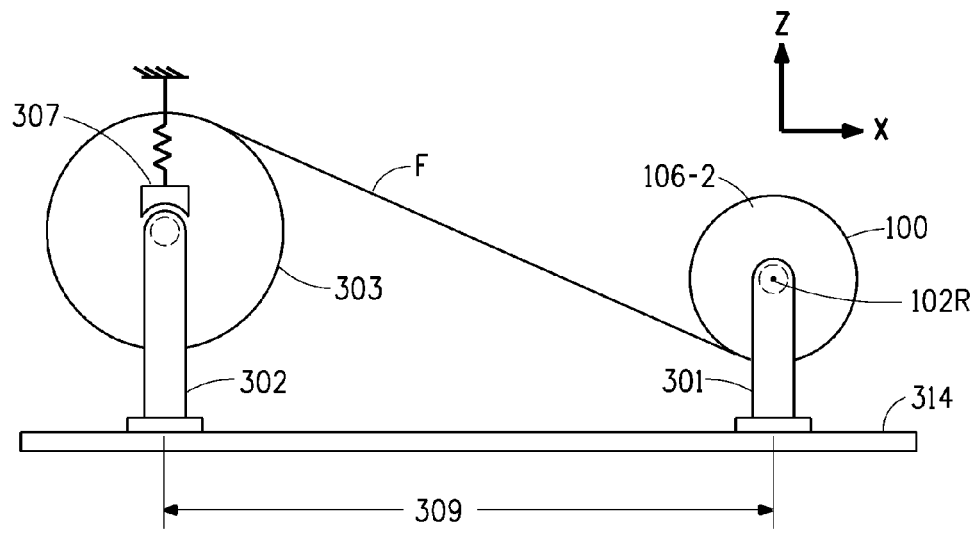
FIGS. 9A, 9B and 9C are diagrammatic views showing an apparatus in accordance with the present invention for loading a film cassette.
Figure 9B:
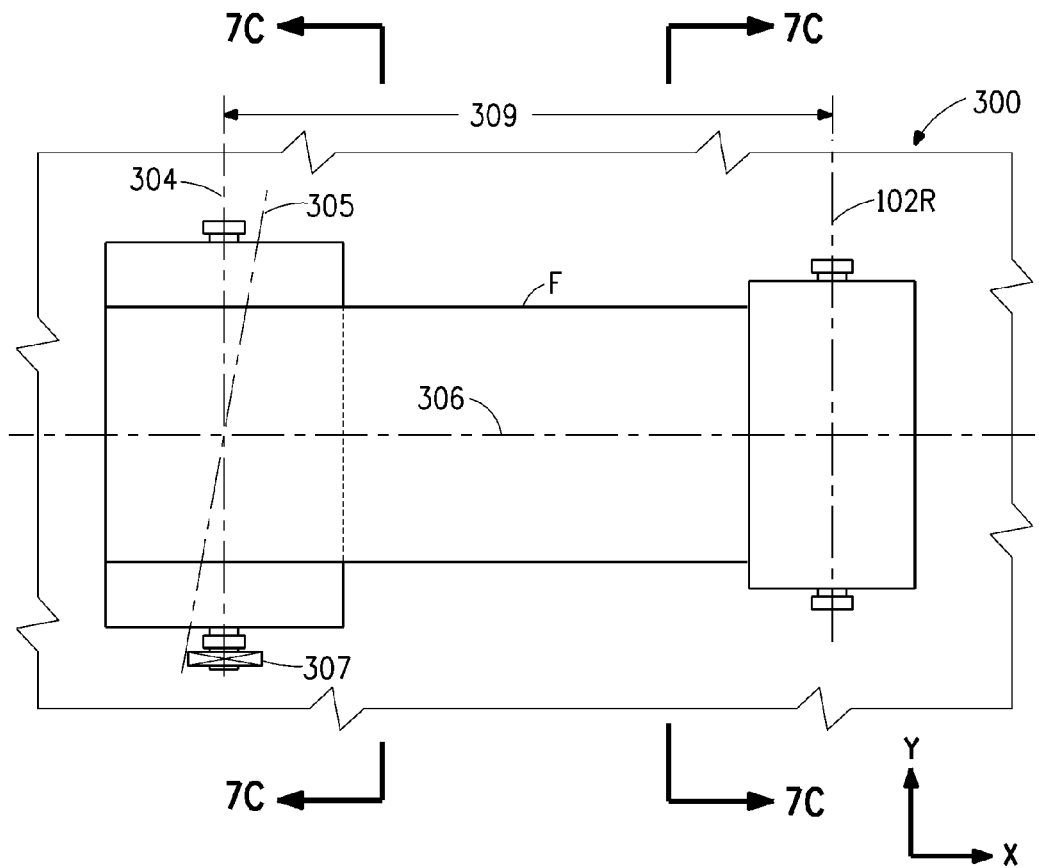
Figure 9C:
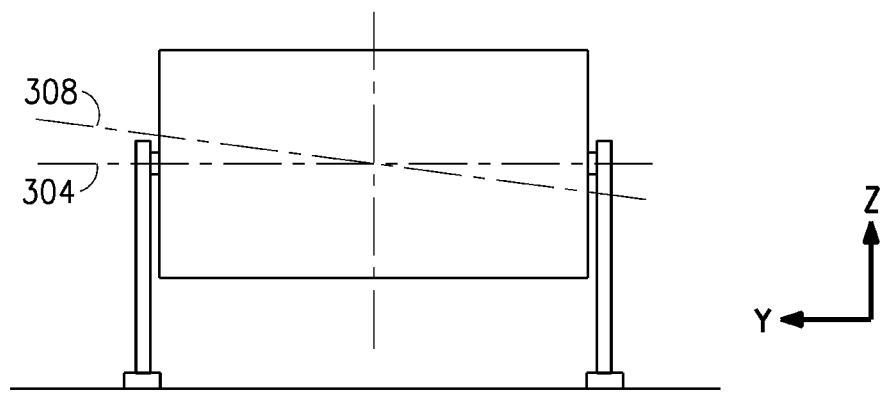

Another aspect of the present invention is an apparatus and method for loading a film cassette 100 for a gaseous vapor deposition process. The apparatus is shown in FIGS. 9A, 9B, and 9C.

The apparatus comprises a unloaded cassette 100 for supporting a length of a film F during a gaseous vapor deposition process as described above. The unloaded cassette 100 itself comprises a central shaft 102 having an axis 102R. The shaft comprises an axially extending slot 102S. The unloaded cassette 100 also comprises a first and a second end plate 106-1, 106-2 mounted to the shaft 102. Each end plate 106-1, 106-2 has a spiral groove 106G. The spiral grooves 106G in each end plate are axially aligned. The end plates 106-1, 106-2 are spaced apart by a predetermined interspoke spacing 114. The cassette is mounted in a cassette mounting stand 301 which allows the cassette to rotate freely about the axis 102R of the central shaft. The cassette mounting stand 301 can be adjusted for lateral alignment. Examples of techniques for lateral alignment adjustment may be insertion of washers or o-rings on the shaft 102. Lateral alignment moves the edges of the end plates of the unloaded cassette relative to a reference plane 306. The center points of a supply roll 303 and the shaft 102 of the cassette should be aligned within about 3 millimeters on a reference plane 306 perpendicular to both axes and passing through both center points. The apparatus also comprises a supply roll mounting stand 302 supporting the supply roll of film 303. The supply roll 303 has an axis 304. The axis of the supply roll 304 is spaced a predetermined distance from the axis of the unloaded cassette 102R. The distance between the axis of the supply roll 304 and the axis of the unloaded cassette 102R is selected according to the width of the film F being coated. The distance between the axes of the supply roll 303 and the unloaded cassette 100 should be between about 0.25 and 3 times the width of the film F.

The cassette mounting stand 301 and the supply roll mounting stand 302 both have axes. These axes should be parallel with 0.5 degrees in the tram (x-direction) and level (z-direction). Potential misalignment in the tram direction of the axes 304, 305 is shown in FIG. 9B. Potential misalignment in the level direction of the axes 304, 308 is shown in FIG. 9C. The mounting stands may comprise mechanical mechanisms to adjust the parallelism of the axes.

Examples of mechanical mechanisms to adjust the parallelism of the axes include leveling screws, jacking bolts, and shims.

The stands 301, 302 could themselves be mounted to a base plate 300, if desired.

The film F is taken from the top of the supply roll 303 and enters the unloaded cassette 100 at the bottom as shown in FIG. 9A. The leading edge of the film is tapered and inserted into the slot 102S on the shaft 102 of the unloaded cassette 100.

A tensioning device 307 is connected to the supply roll of film 303. During film loading into the cassette, the film F is tensioned such that the edges of the supply film remain captured within the spiral grooves in both end plates without producing creasing in the surface of the film as the film is wound onto the cassette. Examples of tensioning devices include pony brakes, pneumatic brakes, magnetic particle clutches, caliper brakes and drum brakes. Dynamic tensioning can also be used. The tensioning device 307 must be capable of smoothly tensioning the film F in a range from about 0.02 to 0.36 Newtons per millimeter of film width.

The present invention is further directed to a process for loading a film cassette for a gaseous vapor deposition process. To eliminate scratching of the film F, traditional film alignment and tensioning techniques which use rolls contacting the film cannot be used. In addition, this process requires tighter specifications on alignment in parallelism and allowable offset distance than traditional web handling processes. Both of these requirements must be satisfied in order to avoid scratching or creasing the film F.

The first step in the process is mounting a supply roll 303 of a film on a first mounting stand 302. The supply roll of the film 303 has a tapered free end. The supply roll having a axis 304 and a reference plane 306 perpendicular to the axis 304 and passing through the center point of the supply roll.

The next step in the process is mounting an unloaded film cassette 100 on a second mounting stand spaced a predetermined distance 309 from the first mounting stand. The unloaded film cassette having an axis 102R and a central reference plane 306 perpendicular to the axis and passing through the center point of the unloaded cassette. The unloaded cassette comprises a central shaft 102 having an axially extending slot 102S. The unloaded cassette also comprises a first 106-1 and a second 106-2 end plate mounted to the shaft 102. Each end plate has a spiral groove 102G. The spiral grooves 102G in each end plate are axially aligned. The end plates are spaced apart by a predetermined interspoke spacing 114. The mounted supply roll and the mounted cassette can be seen in FIGS. 9A and 9B.

The third step in the process is inserting the tapered free end of the film F into the slot 102R in the central shaft 102 of the unloaded cassette 100. The film F should follow a path from the top of the supply roll 303 to bottom of the cassette 100, as shown in FIG. 9A. The length of the taper from the free end of the film to the untapered (i.e., full width) portion of the film should be fifteen to twenty centimeters. The angle between the edge of the untapered and the tapered edged should be in the range of fifteen to thirty degrees.

The fourth step in the process is aligning the central reference plane 306 (shown in FIG. 9B) on each roll to within a predetermined allowable offset distance. The allowable offset distance is the distance between planes perpendicular the supply roll axis 304 and passing through the center point of the supply roll 303, and the unloaded cassette axis 102R and the center point of the cassette shaft 102. The predetermined allowable offset distance is about three millimeters. This alignment may be accomplished by inserting washers, o-rings or shims between the supply roll mounting stand 302 and the supply roll 303 and the cassette mounting stand 301 and the unloaded cassette 100.

The fifth step in the process is aligning the axis of the supply roll and the axis of the unloaded cassette within 0.5 degrees of parallelism with respect to each other in both the tram (x direction) and in the level (z-direction). Alignment is illustrated FIGS. 9B and 9C. This alignment can be accomplished by adjusting level screws, jack bolts or shims associated with the mounting stands.

The sixth step in the process is imposing a predetermined tension into the film. The tension is imparted by a tensioning device 307 located on the supply roll 303. Examples of tensioning devices 307 include pony brakes, magnetic particle clutches, caliper brakes and drum brakes. Dynamic tensioning can also be used. The film F is tensioned in a range from about 0.02 to 0.36 Newtons per millimeter of film width.

The seventh step in the process is rotating the unloaded cassette 100 with respect to the supply roll 303, drawing the film F into the spiral grooves 102G in both end plates 106-1, 106-2 without producing creasing or scratching in the surface of the film F. The unloaded cassette may be rotated manually as long as the film F is not touched.

For film widths greater than about 500 millimeters, the axially extending stiffener V (in FIG. 3) is inserted around the outward end of the film F in the now-loaded cassette. This stiffener minimizes unwinding of the film F from the cassette during handling and coating deposition.

-o-0-o-

Figure 10:
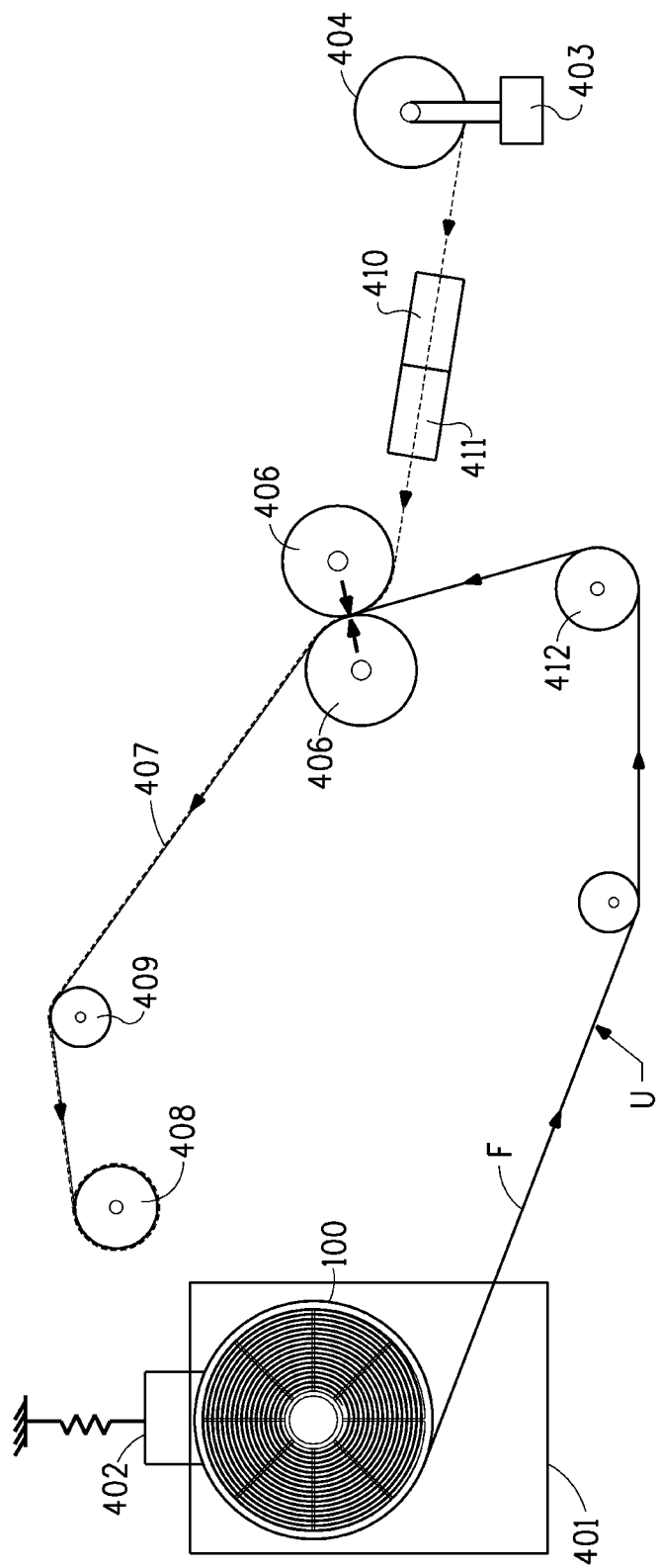
FIG. 10 is a diagrammatic view showing an apparatus in accordance with the present invention for unloading a film cassette and immediately laminating it to a protective cover sheet.

Another aspect of the present invention is an apparatus and method for unloading a film cassette from a gaseous vapor deposition process and laminating it to a protective film to minimize scratching of the ultra-barrier coating. To eliminate scratching of the film F, traditional film alignment and tensioning techniques which use rolls contacting the film cannot be used. In order to protect the coated film until lamination, an apparatus which avoids touching the film ultra-barrier coating U on one surface of the film is needed. The apparatus is shown in FIG. 10.

The unloading apparatus comprises a cassette mounting stand 401 supporting a loaded cassette 100 from a gaseous vapor deposition process. The loaded cassette 100 comprises a central shaft 102 having an axially extending slot 102S. The loaded cassette 100 further comprises a first 106-1 and a second 106-2 end plate mounted to the shaft 102. Each end plate having a spiral groove 102G in it. The spiral grooves 102G in each end plate are axially aligned. The end plates are spaced apart by a predetermined interspoke spacing 114. A coated film F is supported by the spiral grooves 102G. The film has a free outer end. The loaded cassette further comprises a central shaft 102 having an axis 102R.

The unloading apparatus further comprises a tensioning device brake 402 connected to the loaded cassette 100. The tensioning device is a active tensioning device such as magnetic particle brake, pneumatic brake or a friction brake. The tensioning device comprises a load cell 412. Such an integrated tensioning device with a brake and a load cell may be obtained from Dover Flexo Electronics (Rochester, N.H.). The film should be tensioned to between 0.175 to 0.50 Newtons per millimeter.

The unloading apparatus further comprises a mounting stand 403 supporting a roll of protective film 404. The protective film has a free end. The protective film may be any polymer which may be subsequently laminated with use of an adhesive at room temperature or above. For use as barrier layers in photovoltaic modules, a fluoropolymer protective film such FEP, ETFE, and PFA is desirable. Fluoropolymer protective films must be corona treated (Enercon Surface Treatment Inc, Germantown, Wis.) to be laminated.

The unloading apparatus further comprises nip rolls 406 into which the free ends of the coated film F and the protective film 405 are inserted so that they form a laminate 407. The nip rolls 406 should be operated at room temperature or above. The load on the nip rolls should be greater than 0.10 Newtons per millimeter of film width. The nip rolls and tensioning device should be operated to minimize curl of the laminate.

The unloading apparatus further comprises a wind up roll 408 to collect the laminate from the nip rolls.

The wind up roll 408 is connected to a wind up roll tension control device 409. The wind up tension control device may be load cell controlled as may be obtained from MagPowr Inc. (Oklahoma City, Okla.). The tension in the laminate 407 should be greater than 0.10 Newtons per millimeter of film width.

The unloading apparatus further comprises an adhesive coater 410 to apply a adhesive to the protective film 404 located between the roll of protective film 404 and the nip rolls 406. The adhesive coater may be slot-die coater, gravure coater, or a reverse gravure coater. The coater should be appropriate to the adhesive selected for a given application. For a single side corona-treated FEP protective film laminated to an alumina-coated PET substrate an adhesive available from national Starch, Bridgewater, N.J.) under the trademark Duro-Tak is used. A slot-die coater is available from Egan Film and Coating Systems & Blow Molding Systems, Somerville, N.J. The adhesive coater may also apply a solid adhesive to the protective film.

The unloading apparatus further comprises an optional drier 411 to dry the adhesive located between the adhesive coater and the laminator. The drying parameters depend on the adhesive selected.

The present invention is also directed to a process for unloading a film cassette 100 for a gaseous vapor deposition process and laminating it to a protective film. The process description refers to FIG. 10. Dirt or debris on the film contaminate this process. The process should be performed in a clean room environment or a cleaner should be provided prior to the lamination step. The rolls in this process should be aligned as described above for the loading method including parallelism in the tram (x) direction and level (z) direction and lateral alignment, between the cassette nip rolls and all rolls therebetween.

The first step in the process is providing a loaded cassette 100 holding coated film F. The loaded cassette 100 comprises a central shaft 102 having an axially extending slot 102S and a first 106-1 and a second 106-2 end plate mounted to the shaft 102. Each end plate has a spiral groove 102G in it. The spiral grooves 102G in each end plate are axially aligned. The end plates 106-1, 106-2 are spaced apart by a predetermined interspoke spacing 114. The coated film F is supported by the spiral grooves 102G and has a free end. A sacrificial leader may be spliced to the free end of the coated film to establish operating settings.

The next step in the process is providing a roll of protective film 404. The protective film 404 may be any polymer which may be nip laminated at room temperature or above. For use as barrier layers in photovoltaic modules, a fluoropolymer protective film such FEP, ETFE, and PFA is desirable. Fluoropolymer protective films must be corona treated (Enercon Surface Treatment Inc, Germantown, Wis.) to be laminated.

The third step in the process is applying an adhesive to the protective film to form an coated protective film. The adhesive is coated by an adhesive coater 410. The adhesive coater 410 may be slot-die coaters, gravure coaters, and reverse gravure coaters. The coater 410 should be appropriate to the adhesive selected for a given application. For a single side corona-treated FEP protective film laminated to an alumina-coated PET substrate, a durotac 80-1194 (National Starch, Bridgewater, N.J.) adhesive is used in conjunction with a slot-die coater available from Egan Film and Coating Systems & Blow Molding Systems.

Especially for fluoropolymers, a static eliminator should be used where flammable solvents are present such as in the adhesive.

In a fourth step, the adhesive is dried in a drier 411. The drying temperature should be above about 60 degrees centigrade. Drying conditions vary with the adhesive selected.

The fifth step in the process is laminating the coated film and the coated protective film to form a laminate 407. This is done by feeding the adhesive-coated protective film and the coated film into nip rolls 406. The nip rolls 406 should be operated at room temperature or above. The load on the nip rolls 406 should be greater 0.10 Newtons per millimeter of film width. The nip rolls 406 (temperature and pressure) and tensioning device 412 should be operated to minimize curl of the laminate for given materials selected. The curl of a laminate depends on the adhesive, film substrate properties, protective film properties, temperature, pressure, and film tensions. One of ordinary skill in the art can determine the optimum process parameters for selected materials.

In the sixth step, the laminate is collected on a wind up roll 408. The wind up roll 408 is controlled by a wind up roll tension control device 409. The wind up tension control device 409 may be load cell controlled as may be obtained from MagPowr Inc. (Oklahoma City, Okla.). The tension in the laminate 407 should be greater than 0.12 Newtons per millimeter of film width. There is an upper limit to the tension applied to the laminate where the inorganic coating on the film substrate fractures. This limit depends on the inorganic coating material and its thickness.

EXAMPLES

The following Examples illustrate the results of the use of a cassette in accordance with the present invention to support a film substrate during an atomic layer deposition process.

Example 1

Polyethylene terephthalate (PET), uncoated, plastic film, 0.005 inches thick, obtained from DuPont Teijin Films, Hopewell, Va., was manually loaded on a spiral cassette as shown in FIGS. 3-6 with an inner diameter of about 62 mm and an outer diameter of about 200 mm. The cassette with spirally grooved end plates, fabricated from polycarbonate, had a pitch between the spiral grooves of 4.0 mm, and the width of the cassette was about 350 mm. The spacing between turns of the spiral rib (i.e., the spacing 118, FIG. 3, defining the radial width of the groove) was 2.5 mm. The rib thickness was 1.5 millimeters and rib width was 6.5 millimeters. The length of uncoated PET, fully wound on the cassette with 4 mm pitch, was approximately 7 meters. This cassette with PET film was loaded into a reactor (Planar P400A) for depositing a thin film coating of an $Al_2O_3$ barrier layer on both sides of the PET by atomic layer deposition (ALD). Prior to ALD deposition the temperature in the ALD reactor was raised to 100° C. and held there for 3 hours prior to ALD coating to remove any residual water absorbed by the PET plastic film.

For the ALD deposition of $Al_2O_3$ the reactor was maintained at 100° C. The reactants or precursors used for ALD deposition of $Al_2O_3$ were trimethyl aluminum vapor and water vapor. These precursors were introduced sequentially into ALD reactor, which was continuously purged with a nitrogen gas and pumped with a mechanical pump to a background pressure (no reactant or precursor) of about 1 Torr. The nitrogen gas was used as a carrier for the reactants and also, as a purging gas. More specifically, the PET substrate was dosed with water vapor carried by nitrogen gas for 4 seconds, followed by purging of the reactor in flowing nitrogen for 20 seconds. The substrate was then dosed for 4 seconds with trimethyl aluminum vapor carried by nitrogen gas, followed by a 20 second purge in flowing nitrogen. This reaction sequence produced a layer of $Al_2O_3$ on both sides of the PET substrate. The reaction sequence was repeated 200 times, which formed an Al2O3 barrier layer whose thickness was determined by optical ellipsometry to be approximately 29 nm thick on both sides of the PET substrate, 7 meters in length.

To assess the permeation of water vapor through the ALD coated $Al_2O_3$ film, coated on the cassette, the film was unrolled and 2 samples were cut (about 100 mm×100 mm) from the center of the 7 meter long PET. Additionally 2 samples (about 100 mm×100 mm) were cut that were coated near the outer or larger diameter portion of the cassette. The water vapor transmission rate (WVTR) for all four samples was measured in a commercial instrument (MOCON Aquatran-1, Minneapolis, Minn.). This instrument has a sensitivity for WVTR of $5×10^{-4}$ g-$H_2O$/m$^2$-day. All four samples tested below this limit. That is, their WVTR was less than $5×10^{-4}$ g-$H_2O$/m$^2$-day. This is consistent with a uniform and high quality coating of $Al_2O_3$ over the entire 4-mm pitch cassette.

Example 2

The experiment described in Example 1 was repeated with a cassette that had a 2 mm pitch between spiral grooves. The rib thickness was 1.0 millimeters and rib width was 6.5 millimeters. That is, the uncoated PET loaded on this cassette was 350 mm wide×about 14 meters in length. (i.e., the spacing 118, FIG. 3, defining the radial width of the groove) was 1.0 mm. The 2 mm-spiral with uncoated PET was loaded into the ALD reactor and heated in the ALD reactor at 100° C. to remove residual water vapor absorbed by the PET, followed by ALD deposition of $Al_2O_3$ at 100° C. on both sides of the PET. The ALD deposition process consisted of dosing with water vapor, carried by nitrogen gas, for 8 seconds, followed by purging of the reactor in flowing nitrogen for 50 seconds.

The PET substrate on the 2 mm-pitch cassette was then dosed for 8 seconds with trimethyl aluminum vapor carried by nitrogen gas, followed by a 50 second purge in flowing nitrogen. This reaction sequence produced a layer of $Al_2O_3$ on both sides of the PET substrate. The reaction sequence was repeated 200 times, which formed an $Al_2O_3$ barrier layer whose thickness was determined by optical ellipsometry to be approximately 30 nm thick on both sides of the PET substrate, 14 meters in length.

The water vapor transmission rate (WVTR) was measured for four samples on the ALD coated PET after unrolling it from the cassette. Two samples were measured from the middle of the unrolled PET and two samples were taken from the PET coated at a location near the outer diameter of the spiral. All four measurements were below the sensitivity of the MOCON Aquatran-1 instrument of $5\times10^{-4}$ g-$H_2O/m^2$-day. That is, their WVTR was less than $5\times10^{-4}$ g-$H_2O/m^2$-day. This is consistent with a uniform and high quality coating of $Al_2O_3$ over the entire 2-mm pitch cassette.

These Examples demonstrate that use of a cassette, loaded and processed in a vapor deposition apparatus, all as described in accordance with the present invention, produced a superior barrier film having a water vapor transmission rate less than $5\times10^{-4}$ g-$H_2O/m^2$-day.

Those skilled in the art, having the benefit of the teachings of the present invention as hereinabove set forth may effect numerous modifications thereto. Such modifications are to be construed as lying within the contemplation of the present invention as defined by the appended claims.

What is claimed is:

1. An apparatus for loading a film cassette for a gaseous vapor deposition process comprising:
   a cassette mounting stand for supporting an unloaded film cassette, the unloaded cassette itself comprising
      a central shaft having an axis therethrough, the shaft having an axially extending slot therein;
      a first and a second end plate mounted to the shaft, each end plate having a spiral groove therein, the spiral grooves in each end plate being axially aligned, the end plate being spacing apart by a predetermined interspoke spacing;
   a supply roll mounting stand for supporting a supply roll of film, the supply roll having an axis therethrough, the axis of the supply roll being spaced a predetermined distance from the axis of the cassette, the supply roll of the film and the cassette each have a central reference plane defined therein;
   a tensioning device connected to the supply roll of film, wherein the tension applied to the supply roll coupled with
      (a) the axis of the supply roll and the axis of the unloaded cassette being parallel with each other to within 0.5 degrees,
      (b) the distance between the supply roll and the cassette being such that a predetermined allowable offset distance between the reference plane of the supply roll and the reference plane of the unloaded cassette is less than about three millimeters, and
      (c) the distance between the axis of the supply roll and the axis of the cassette being from 0.15 to three (3) times the interspoke spacing
   are such that the edges of the supply film remain captured within the spiral grooves in both end plates without producing creasing in the surface of the film as the film is wound onto the cassette.

2. An process for loading a film cassette for a gaseous vapor deposition process comprising the steps of:
   a) mounting a supply roll of a film on a first mounting stand, the supply roll of the film having a tapered free end, the supply roll having a central reference plane defined therein;
   b) mounting an unloaded film cassette on a second mounting stand spaced a predetermined distance from the first mounting stand, the unloaded film cassette having a central reference plane defined therein, the film cassette having
      a central shaft having an axially extending slot formed therein,
      a first and a second end plate mounted to the shaft, each end plate having a spiral groove therein, the spiral grooves in each end plate being axially aligned,
      the end plates being spacing apart by a predetermined interspoke spacing,
      wherein, the predetermined allowable range of parallelism between the axis of the supply roll and the axis of the unloaded cassette is within 0.5 degrees,
      the predetermined allowable offset distance between the reference plane of the supply roll and the reference plane of the unloaded cassette is less than about three millimeters, and
      the distance between the axis of the supply roll and the axis of the cassette is between one to three times the interspoke spacing;
   c) inserting the tapered free end of the film into the slot in the central shaft;
   d) aligning the central reference planes defined on each roll to within a predetermined allowable offset distance;
   e) aligning the axis of the supply roll and the axis of the unloaded cassette within a predetermined allowable range of parallelism with each other,
   f) imposing a predetermined tension into the film; and thereafter,
   g) rotating the cassette with respect to the supply roll thereby to draw the film into the spiral grooves in both end plates without producing creasing in the surface of the film.

* * * * *